United States Patent [19]

Martinelli

[11] Patent Number: 4,605,948
[45] Date of Patent: Aug. 12, 1986

[54] SEMICONDUCTOR STRUCTURE FOR ELECTRIC FIELD DISTRIBUTION

[75] Inventor: Ramon U. Martinelli, Hightstown Borough, N.J.

[73] Assignee: RCA Corporation, Princeton, N.J.

[21] Appl. No.: 637,027

[22] Filed: Aug. 2, 1984

[51] Int. Cl.$^4$ ............ H01L 29/72; H01L 29/06; H01L 29/90; H01L 29/34
[52] U.S. Cl. ............................. 357/34; 357/20; 357/13; 357/52
[58] Field of Search .................. 357/34, 20, 13, 52

[56] References Cited

U.S. PATENT DOCUMENTS 3,921,199 11/1975 Yuan et al. ........................... 357/20
3,971,061 7/1976 Matsushita et al. .................. 357/52

OTHER PUBLICATIONS

High Voltage Thin Layer Devices (Resurf Devices), J. A. Appels et al., *IEDM Technical Digest*, 1979, pp. 238–241.
Physics and Technology of Semiconductor Devices, A. S. Grove, John Wiley and Sons, Inc., New York, 1967, pp. 191–193.

*Primary Examiner*—Andrew J. James
*Assistant Examiner*—Terri M. Henn
*Attorney, Agent, or Firm*—Birgit E. Morris; Donald S. Cohen; Kenneth R. Glick

[57] ABSTRACT

A semiconductor device structure incorporates a semiconductor wafer having first and second opposing major surfaces and an edge. A first region of first conductivity type is contiguous with the second surface and includes an edge portion which is contiguous with the wafer edge at the first surface. A second region, of second conductivity type, extends into the wafer from the first surface so as to form a PN junction with the first region at a predetermined depth from the first surface. A third region, of second conductivity type, extends into the wafer from the first surface to a depth greater than the predetermined depth. The third region is disposed between and is contiguous with the second region and the edge portion of the first region. When the wafer is silicon the third region has an areal charge concentration of approximately 1 to $2 \times 10^{12}$ cm$^{-2}$.

10 Claims, 5 Drawing Figures

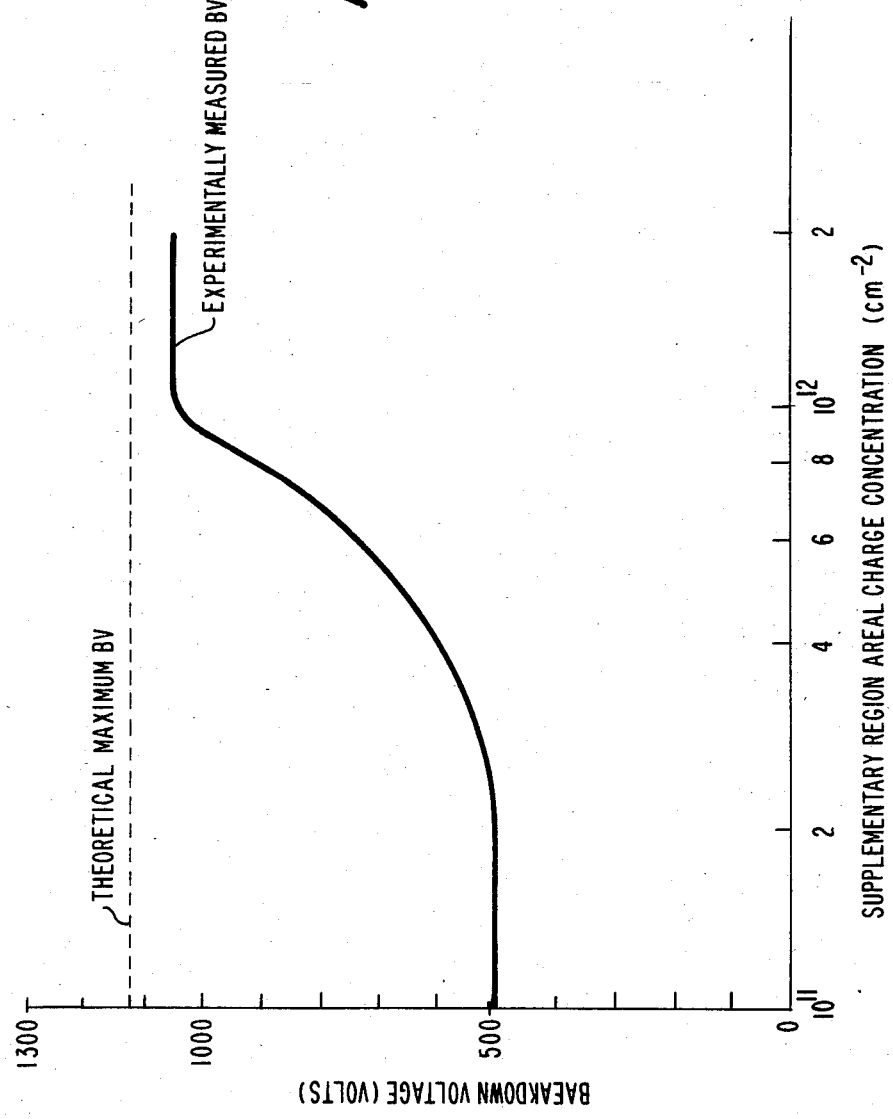

SEMICONDUCTOR STRUCTURE FOR ELECTRIC FIELD DISTRIBUTION

The present invention relates to a structure wherein a PN junction intercepts a semiconductor wafer surface. More particularly, the invention relates to a structure which permits a relatively high voltage to be sustained at such a PN junction.

BACKGROUND OF THE INVENTION

A solid-state semiconductor device usually comprises a wafer of semiconductor material in which doped P type and N type regions form one or more PN junctions. Typically, several of these PN junctions intercept a surface of the wafer. For example, in what is commonly referred to as a planar semiconductor device, ie., a device wherein P type and/or N type conductivity regions are diffused into the semiconductor from selected portions of a major wafer surface, the PN junction associated with each of the diffused regions intercepts the major wafer surface.

When a semiconductor device is used in a power control application, certain of the PN junctions therein must support relatively high voltages during device operation. Such PN junctions are typically referred to as high voltage junctions, and it is desirable that they be able to support voltages which approach the theoretical bulk breakdown value associated therewith. The theoretical bulk breakdown voltage of a PN junction is a function of the doping profiles in the P type and N type regions adjacent thereto and the geometry of the junction.

The effect of PN junction geometry on breakdown voltage is quite apparent, for example, in planar double-diffused bipolar power transistors. So as to spread the electric field associated with the high voltage base/collector PN junction of such devices, one approach has been to incorporate a relatively lightly doped epitaxial layer, of similar conductivity type to the base region, between the base and collector regions. Such an approach, as described in HIGH VOLTAGE THIN LAYER DEVICES (RESURF DEVICES), J. A. Appels et al., IEDM Technical Digest, 1979, pp. 238–241, essentially renders the base/collector PN junction plane in shape. However, there is a drawback to this prior art RESURF structure in that the additional epitaxial layer effectively widens the device base region. This in turn decreases device switching speed in that the limiting frequency, $f_T$, is proportional to the inverse square of the width of the base region between the emitter and collector regions.

SUMMARY OF THE INVENTION

A semiconductor device structure incorporates a semiconductor wafer having first and second opposing major surfaces and an edge. A first region of first conductivity type is contiguous with the second surface and includes an edge portion which is contiguous with the wafer edge and extends to the first surface. A second region, of second conductivity type, extends into the wafer from the first surface so as to form a PN junction with the first region at a predetermined depth from the first surface. A third region, of second conductivity type, extends into the wafer from the first surface to a depth greater than the predetermined depth. The third region is disposed between and is contiguous with the second region and the edge portion of the first region. When the wafer is silicon the third region has an areal charge concentration of approximately 1 to $2 \times 10^{12}$ cm$^{-2}$.

BRIEF DESCRIPTION OF THE DRAWING

FIG. 5 is a graphic representation of the breakdown voltage achievable by a structure of the present invention.

DETAILED DESCRIPTION OF THE PREFERRED EMBODIMENT

Figure 1:
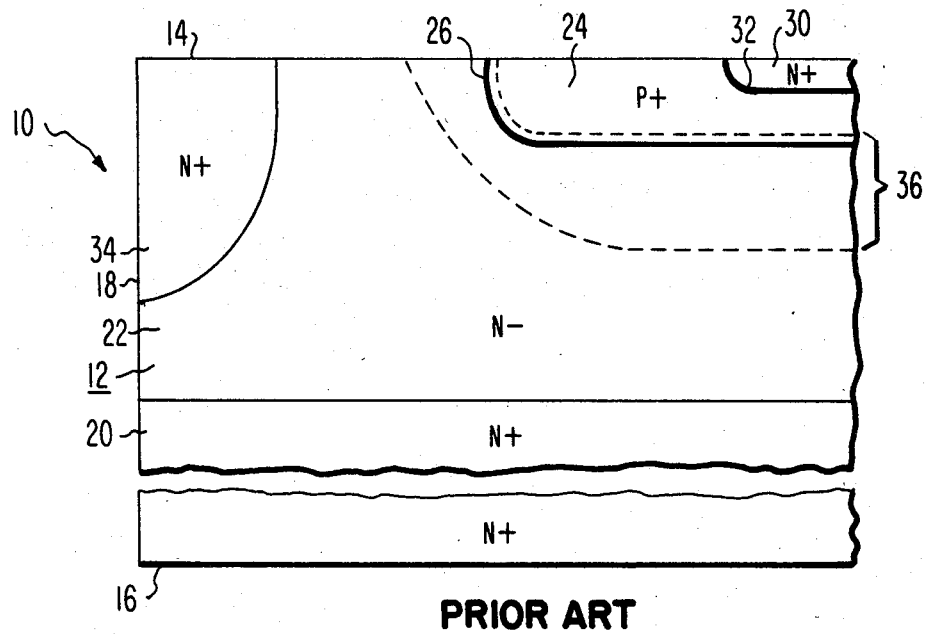
FIG. 1 is a sectional view of a planar NPN bipolar transistor with no electric field distributing means.

Illustrated in FIG. 1 is a sectional view of a portion of a conventional planar NPN bipolar transistor 10. The transistor 10 comprises a semiconductor substrate 12 having first and second opposing major surfaces 14 and 16 and an edge 18. A collector region 20 of N+ type conductivity is contiguous with the second major surface 16 and is substantially planar in shape. Extending from the collector region 20 to the first major surface 14 is an N− type extended collector region 22. Typically, the N+ type collector region 20 and N− type extended collector region 22 are fabricated by providing an N+ type substrate and epitaxially growing an N− layer thereon.

Extending into the wafer 12 from the first surface 14 is a P+ type base region 24 which forms a base/collector PN junction 26 at its interface with the N− type extended collector region 22. The base region 24 is typically formed by selectively doping a portion of the surface 14 and subsequently diffusing the dopant such that the PN junction 26 extends from an intercept on the surface 14 to a predetermined depth from the surface 14.

Extending into the wafer 12 from the surface 14 within the boundary of the base region 24 is an N+ type emitter region 30. The emitter region 30 forms an emitter/base PN junction 32 at its interface with the base region 24. The emitter region 30 is also typically formed by selectively doping and diffusing conductivity modifiers from the first surface 14 such that the emitter/base PN junction 32 extends to a predetermined depth and curves to intercept the surface 14. Additionally, at the corner of the wafer 12 created by the intersection of the first major surface 14 and the edge 18 there is a channel-stopper region 34 of N+ type conductivity.

During device operation the base/collector PN junction 26 supports voltage which creates a depletion region 36, i.e., a region which is depleted of mobile charge carriers, in portions of the base and collector regions adjacent to the junction. Similarly, a depletion region is formed in the emitter and base regions adjacent to the emitter/base PN junction. In the illustrated configuration, the base/collector PN junction 26 is typically required to support relatively high voltages compared to the emitter/base PN junction 32. Thus, the size of the depletion region associated with the base/collector PN junction 26 is significantly greater than that of the depletion region associated with the emitter/base PN junction 32. For purposes of clarity, only the base/collector PN junction depletion region 36 is illustrated in FIG. 1.

The size of the depletion region in a particular semiconductor region is a function of the impurity concentration profile therein, the geometry of the PN junction, the voltage being supported by the junction and the boundary conditions at the termination of the junction. For a given voltage, the wider the depletion region the lower the electric field at the junction. The theoretical maximum voltage that the junction can support is referred to as the bulk breakdown voltage and is determined by the electric field at the junction. The depletion region width and the electric field at the junction are maximum at the bulk breakdown voltage.

Figure 2:
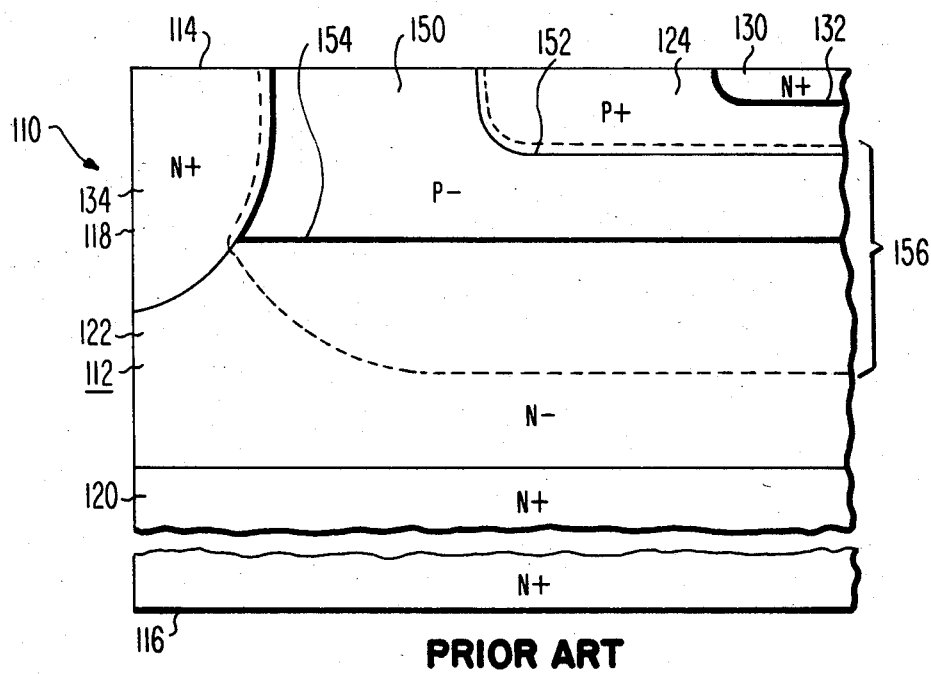
FIG. 2 is a sectional view of a prior art RESURF structure on a planar NPN bipolar transistor.

To increase the breakdown voltage of the transistor 10 of FIG. 1 the interposition of a blanket P− type layer between the P+ type body region and N− type collector region has been suggested, as illustrated by the RESURF (REduced SURface Field) structure in the planar NPN bipolar transistor 110 of FIG. 2. Those features of the transistor 110 which are analogous to features of the transistor 10 of FIG. 1 are designated by similar reference numbers preceded by the numeral 1. The transistor 110 also comprises a substrate 112 having first and second major surfaces 114 and 116, an edge 118, an N+ type collector region 120, an N− type extended collector region 122, a P+ type base region 124, an N+ type emitter region 130 forming an emitter/base PN junction 132, and a channel stopper region 134. The significant structural difference between the transistor 110 and the transistor 10 is the presence of what will be termed herein a blanket base layer 150, disposed between the N− type extended collector region 122 and the first major surface 114.

The blanket base layer 150 is conventionally formed by epitaxially depositing a P− type layer on the N− type extended collector region 122. The doping level in the blanket base layer 150 is less than that in the P+ type base region 124, such that a high/low junction 152 exists between the base region 124 and the blanket base layer 150. In that the P+ type base region 124 is contiguous with the P− type blanket base layer 150, and the blanket base layer 150 interfaces with the N− type extended collector region 122, a base/collector PN junction 154 is formed at the blanket layer/extended collector region interface. A typical thickness for the P− type blanket base layer 150 is 9 microns, a typical diffusion depth for the P+ type body region 124 is 5 microns, and a typical diffusion depth for the N+ type emitter region 130 is 2 microns. Thus, for transistor 110, the distance between the emitter/base PN junction 132 and the base/collector PN junction 154, termed the device base width, is 7 microns.

In the transistor 110 the N+ channel stopper region 134 extends from the first surface 114 to a depth greater than the thickness of the blanket base layer 150 such that it interfaces with the extended collector region 122. Since the channel stopper region 134 is also contiguous with the blanket base layer 150, the base/collector PN junction 154 is continuous with the interface of the channel stopper region 134 and the blanket base layer 150, and thereby extends to intercept the first surface 114. During device operation a depletion region 156 spreads into the N+ type channel stopper region 134, the N− type extended collector region 122, the P− type blanket base layer 150 and the P+ type body region 124.

Figure 3:
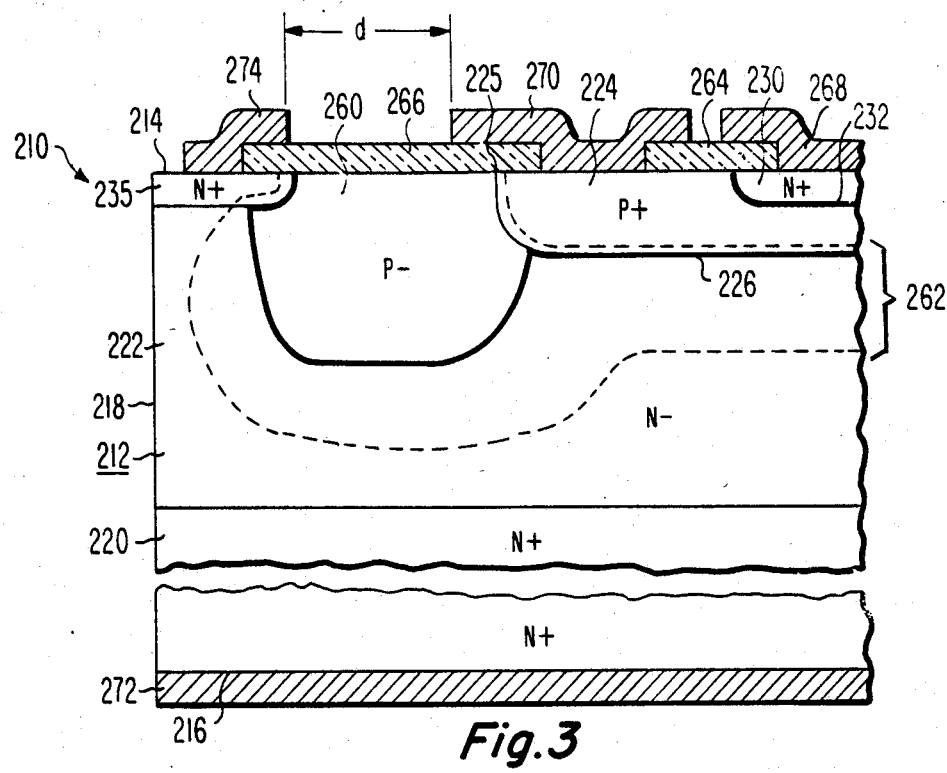
FIG. 3 is a sectional view of the electric field distributing structure of the present invention.

In contrast with the conventional RESURF structure of FIG. 2, a planar, bipolar NPN transistor 210 incorporating the field distributing structure of the present invention is illustrated in FIG. 3. The transistor 210 is embodied in a semiconductor wafer 212 having first and second opposing major surfaces 214 and 216 and an edge 218. An N+ type collector region 220, substantially planar in shape, is contiguous with the second major surface 216, and an N− type extended collector region 222 is contiguous with the N+ type collector region 220. Extending into the wafer from the first surface 214 is a P+ type base region 224 which forms a base/collector PN junction 226 with the N− extended collector region 222. The P+ base region 224 has a boundary 225 which intercepts the major surface 214, and within this boundary 225 an N+ type emitter region 230 extends from the surface 214 so as to form an emitter/base PN junction 232 with the base region 224. An N+ type channel stopper region 235 extends into the wafer from the first surface 214 at the edge 218. However, as will subsequently be elaborated upon, in the transistor 210 of the present invention, the channel stopper region 235 need not extend as deeply into the wafer as the channel stopper region 134 in the transistor 110 incorporating the prior art RESURF structure.

Disposed between the base region 224 and the channel stopper 235 in a substantially annular configuration, is a supplementary region 260 of P− type conductivity. The supplementary region 260 extends from the first surface 214 to a depth greater than that of the base region 224, and preferably to a depth greater than approximately twice that of the base region 224. For example, when the base region 224 extends to a depth of 4–10 microns, the supplementary region 260 will extend, respectively, to a depth of 8–20 microns. The supplementary region 260 is required to be contiguous with the base region 224 such that the interface between the supplementary region 260 and the N− collector region 222 forms an extension of the base/collector PN junction 226. In the illustrated embodiment the supplementary region 260 is also contiguous with the channel stopper region 235 such that the interface between the supplementary region 260 and the channel stopper region 235 provides an additional extension to the base/collector PN junction 226 and terminates at the first surface 214. However, it is not imperative that the base/collector PN junction 226 interface with the channel stopper region 235, as will be subsequently illustrated.

In more general terms, the N+ type collector region 220, the N− type extended collector region 222 and the channel stopper region 235 may all be considered to be part of a first region of first conductivity type; the P+ type base region 224 may be considered to be a second region, of second conductivity type; the P− type supplementary region 260 may be considered to be a third region, of second conductivity type; and the emitter region 220 may be considered to be a fourth region, of first conductivity type.

The areal charge concentration in the supplementary region 260, as determined by doping level, is selected such that the supplementary region 260 is fully depleted when the base/collector PN junction 226 is supporting a voltage which approaches its theoretical bulk breakdown voltage. When the semiconductor wafer 212 is silicon, the areal charge concentration in the supplementary region 260 should be approximately 1 to $2 \times 10^{12}\,cm^2$. Thus, the areal charge concentration in the supplementary region 260 is not dependent upon the doping level in the N− type collector region 222. The depletion region associated with the base/collector PN junction 226 when the junction is supporting its bulk breakdown voltage is illustrated at 262. One of the significant characteristics of the depletion region 262 is its concave configuration in the N− extended collector region 222. This concave configuration occurs because the depth of the supplementary region 260 is greater than that of the base region 224.

A preferred electrode structure for the transistor 210 is also illustrated in FIG. 3. First and second insulating layers 264 and 266 overlie the emitter/base PN junction 232 and the base/collector PN junction 226 at their respective intercepts with the first surface 214. The second insulating layer 266 additionally extends to overlie the boundary 225 of the base region 224 as well as the depletion region 262 associated with the base/collector PN junction 226 at the surface 214. Emitter and base electrodes, 268 and 270 respectively, contact the emitter and base regions 230 and 224 on the first surface 214, and a collector electrode 272 contacts the N+ type collector region 220 on the second major surface 216.

On the first surface 214, a supplementary collector electrode 274 contacts the channel stopper region 235. Both the supplementary collector electrode 274 and the base electrode 270 overlap the second insulating layer 266. Preferably, the supplementary collector electrode 274 overlies the boundary of channel stopper region 235 at the first surface 214, and the base electrode 270 overlies the intercept of the base region boundary 225 at the first surface 214, as well. The supplementary collector electrode 274 and the base electrode 270 are separated by a distance d as indicated in FIG. 3. The optimal value for this distance may be calculated as a function of the bulk breakdown voltage of the base/collector PN junction 226. As an optimal value, the distance d, in microns, should equal the bulk breakdown voltage value, in volts, divided by 10 volts/micron ($=10^5$ volts/cm), the critical field for avalanche breakdown in silicon.

The transistor 210 of the present invention can be fabricated by conventional semiconductor processing techniques. For example, starting with an N+ type substrate, an N− type epitaxial layer may be deposited thereon and the indicated N+, P+ and P− regions may subsequently be diffused into the epitaxial layer from the surface thereof. Significant processing distinctions between the transistor 210 and the conventional transistor 110 include: the elimination of the steps needed to form the blanket base layer 150, the provision of a selective P− doping and diffusion, the elimination of the need for a relatively deep channel stopper region, and a different electrode structure on the wafer surface.

Figure 4:
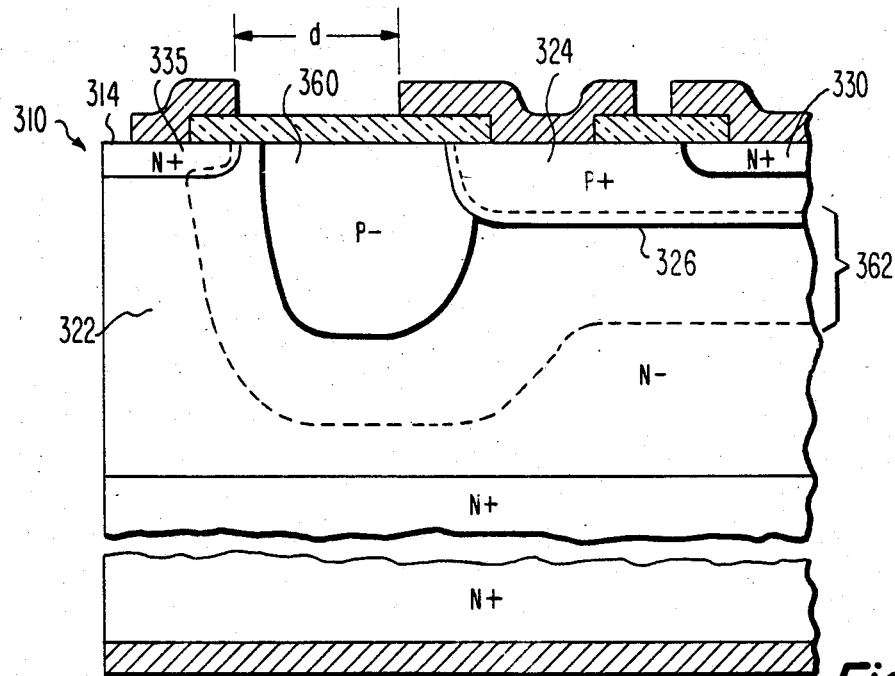
FIG. 4 is a sectional view of a second embodiment of the electric field distribution structure of the present invention.

As shown in FIG. 4, an alternative embodiment of the invention provides a modified configuration for the supplementary region. FIG. 4 illustrates a planar NPN bipolar transistor 310 which is substantially similar to the transistor 210 of FIG. 3 but for the dimensions of the P− type supplementary region 360 therein. The P− type supplementary region 360 in transistor 310 is disposed between P+ type base region 324 and N+ type channel stopper 335. However, the P− type supplementary region 360 is not contiguous with the channel stopper region 335. Rather, a portion of the N− type collector region 322 extends to the first surface 314 between the supplementary region 360 and the channel stopper region 335. The areal charge concentration in the supplementary region 360 should be in the same range as the areal charge concentration in the supplementary region 260 of transistor 210.

The structure of transistor 310 provides a similar electric field redistribution to that produced in transistor 210. The PN junction formed between the supplementary region 360 and the extended collector region 322 is contiguous with the high voltage base/collector PN junction 326 thereby yielding a depletion region 362 which is concave in the N− type extended collector region, as in transistor 210. Transistor 310 can be fabricated in a substantially similar manner as transistor 210. The significant difference is the location of the selective doping and diffusion used to generate the supplementary region 360.

A graphic representation of the effectiveness of the present invention is shown in FIG. 5. The graph represents the breakdown voltage of the base/collector PN junction 226 of transistor 210 as a function of the areal charge concentration in the supplementary region 260. As indicated, when the areal charge concentration is in the optimal range of approximately $1-2 \times 10^{12}$ cm$^{-2}$, a base/collector PN junction breakdown voltage which is approximately 95% of the theoretical maximum breakdown voltage is achieved. Based upon an experimentally measured doping profile for the base and extended collector regions 224 and 222, the theoretical maximum breakdown voltage of the base/collector PN junction 226 is 1115 volts. The measured breakdown voltage for this junction, when the doping level in the supplementary region 260 is in the indicated optimal range of approximately 1 to $2 \times 10^{12}$ cm$^{-2}$, is 1050 volts.

The structures of the present invention thus present several advantages over the prior art. The elimination of the P− type blanket base layer 150 from the conventional transistor 110 eliminates an epitaxial deposition or diffusion step. However, more importantly, it permits a base/collector PN junctiion breakdown voltage which approaches the maximum breakdown voltage, without sacrificing base width. As previously indicated, in that the maximum frequency of device operation is proportional to the inverse square of the device base width, the presence of the blanket base layer 150 limits the frequency of operation of the conventional transistor 110. In that the necessity for a blanket P− type layer is eliminated in the present invention, devices of the present invention can be operated at higher frequencies.

The prior art structure 110 also requires that the channel stopper region 134 extend from the first surface 114 to the N− type extended collector region 122. The channel stopper region 134 must extend through the thickness of the blanket base layer 150. This requires an additional diffusion step in the processing sequence for device 110 which is not necessary in the structures of the present invention. The channel stopper regions 235 and 335 of the devices of the present invention may be doped and diffused to the same depth as the corresponding emitter regions 230 and 330 and may thus be processed simultaneously with the emitter regions.

It is also important to recognize that the structure of the present invention is not limited to NPN bipolar transistors. In addition to being applicable to diodes, thyristors, and PNP bipolar transistors, the present invention is applicable to MOS structures. For example, a supplementary region 260 or 360 may readily be incorporated into a conventional vertical MOSFET device, an example of which is disclosed in U.S. Pat. No. 4,455,565, VERTICAL MOSFET WITH AN ALIGNED GATE ELECTRODE AND ALIGNED DRAIN SHIELD ELECTRODE, A. M. Goodman et al., June 19, 1984, the supplementary region being located so as to be contiguous with a body region of the device. The conventional RESURF structure of FIG. 2 is not applicable to a vertical MOSFET device in that the blanket base layer 150 does not make it possible for the collector region, ie., the drain region in an analogous MOSFET, to contact the first surface 114 at portions where the MOSFET channels are to be formed.

What is claimed is:

1. A semiconductor structure, comprising:
   a silicon wafer having first and second opposing major surfaces and an edge,
   a first region, of first conductivity type, contiguous with the second surface and including an edge portion which is contiguous with said edge at the first surface;
   a second region, of second conductivity type, extending into the wafer from the first surface so as to form a PN junction with the first region at a predetermined depth from the first surface;
   a third region, of second conductivity type, extending into the wafer from the first surface to a depth greater than said predetermined depth, the third region being disposed between and being contiguous with the second region and said edge portion, and having an areal charge concentration of approximately $1-2 \times 10^{12}$ cm$^{-2}$;
   an insulating layer overlying the third region on the first surface, said insulating layer overlying the boundary between the edge portion and the third region, and the boundary between the second region and the third region;
   a first electrode contacting the edge portion at the first surface and overlying the insulating layer; and
   a second electrode contacting the second region at the first surface, overlying the insulating layer, and being spaced a predetermined distance from the first electrode; said predetermined distance, in microns, being equal to the bulk breakdown voltage, in volts, divided by the critical field for avalanche breakdown, in volts per micron, of the PN junction between the first and second regions.

2. A semiconductor structure in accordance with claim 1, wherein said first region further comprises:
   a substrate having a uniformly doped layer of relatively low conductivity disposed thereon.

3. A semiconductor structure in accordance with claim 1, wherein said first region further comprises:
   a channel stopper region of relatively high conductivity extending into the wafer from the first surface at said edge portion.

4. A semiconductor structure in accordance with claim 1, further comprising:
   a fourth region, of first conductivity type, extending into the wafer from the first surface within the boundary of the second region so as to form a bipolar transistor with said first and second regions.

5. A semiconductor structure, comprising:
   a semiconductor wafer having first and second opposing major surfaces and an edge;
   a first region, of first conductivity type, contiguous with the second surface and including an edge portion which is contiguous with said edge at the first surface;
   a second region, of second conductivity type, extending into the wafer from the first surface so as to form a PN junction with the first region at a predetermined depth from the first surface said PN junction having a theoretical bulk breakdown voltage;
   a third region, of second conductivity type, extending into the wafer from the first surface to a depth greater than said predetermined depth, the third region being disposed between and being contiguous with the second region and said edge portion, and having an areal charge concentration such that the third region is fully depleted only when said PN junction is biased by a voltage greater than approximately 95% of said bulk breakdown voltage;
   an insulating layer overlying the third region on the first surface, said insulating layer overlying the boundary between the edge portion and the third region, and the boundary between the second region and the third region;
   a first electrode contacting the edge portion at the first surface and overlying the insulating layer; and
   a second electrode contacting the second region at the first surface, overlying the insulating layer, and being spaced a predetermined distance from the first electrode; said predetermined distance, in microns, being equal to the bulk breakdown voltage, in volts, divided by the critical field for avalanche breakdown, in volts per micron, of the PN junction between the first and second regions.

6. A semiconductor structure in accordance with claim 5, wherein said first region further comprises:
   a semiconductor substrate; and
   a uniformly doped layer of relatively low conductivity disposed thereon.

7. A semiconductor structure in accordance with claim 5, wherein said first region further comprises:
   a channel stopper region of relatively high conductivity extending into the wafer from the first surface at said edge portion.

8. A semiconductor structure in accordance with claim 5, further comprising:
   a fourth region, of first conductivity type, extending into the wafer from the first surface within the boundary of the second region so as to form a bipolar transistor with said first and second regions.

9. A semiconductor structure in accordance with claim 4, wherein said first region further comprises a channel stopper region of relatively high conductivity extending into the wafer from the first surface at said edge portion, the channel stopper region extending to a depth substantially equal to that of said fourth region.

10. A semiconductor structure in accordance with claim 8, wherein said first region further comprises a channel stopper region of relatively high conductivity extending into the wafer from the first surface at said edge portion, the channel stopper region extending to a depth substantially equal to that of said fourth region.

* * * * *